United States Patent
Umanskiy et al.

[11] Patent Number: 5,898,303
[45] Date of Patent: Apr. 27, 1999

[54] STATIC ACTUATOR TESTER AND METHOD

[75] Inventors: Yuriy Umanskiy; Vladimir Vaninskiy, both of Aurora, Colo.

[73] Assignee: Storage Test Solutions, Inc., Lafayette, Colo.

[21] Appl. No.: 08/916,193

[22] Filed: Aug. 21, 1997

[51] Int. Cl.$^6$ .................... G01R 31/02; G01R 31/302
[52] U.S. Cl. .................. 324/210; 324/538; 324/763; 228/104
[58] Field of Search ................... 324/211, 210, 324/212, 537, 538, 546, 763, 764, 691, 713, 66; 360/113; 369/53, 54; 371/22.5, 22.6; 29/593; 228/8, 103, 104

[56] References Cited

U.S. PATENT DOCUMENTS

| | | | |
|---|---|---|---|
| 5,285,948 | 2/1994 | Rupp et al. | 228/104 |
| 5,589,777 | 12/1996 | Davis et al. | 324/537 |

OTHER PUBLICATIONS

Texas Instruments, "TLS24508DBT (MAXTOR) 8 Channel Magneto–Resistive/Thin Film Read/Write Preamplifier," Preliminary Specification, Rev. 0.2 (Mar. 1996).

*Primary Examiner*—Jay M. Patidar
*Attorney, Agent, or Firm*—Fliesler Dubb Meyer & Lovejoy LLP

[57] ABSTRACT

A test method and apparatus for use with a plurality of magnetically sensitive elements having a fixed relative physical sequence, and with a plurality of electrical lead sets through each of which the magnetic field being experienced by a respective one of said magnetically sensitive elements can be sensed. The method includes the steps of placing the magnetically sensitive elements in a variable magnetic field and determining a respective magnetic field setting at which each given one of the lead sets indicates the presence of a magnetic null. The results of such a test can be used to determine which lead sets are connected to which magnetic elements, and/or to determine whether at least one lead set is mis-connected.

45 Claims, 9 Drawing Sheets

STATIC ACTUATOR TESTER AND METHOD

BACKGROUND

1. Field of the Invention

The invention relates to techniques for testing an assembly having a plurality of magnetically sensitive elements and, more particularly, to apparatus and techniques for testing the accuracy of electrical connections made to magnetic disk heads.

2. Description of Related Art

A magnetic head assembly for a disk drive typically consists of an actuator which is rotatably mountable on an actuator axis of the disk drive, and a plurality of magnetic heads mounted at the end of respective flexures which extend radially outward from the actuator. For a typical disk drive having anywhere between two and six double-sided platters, the head assembly (which is also called a head stack) has a corresponding number of typically 4–12 heads. Each head is magnetically sensitive so as to be able to read data stored magnetically on one or the other surface of a platter. The heads are designed to be particularly sensitive in the direction facing the platter surface to which it is assigned. The heads are arranged linearly on their respective flexures, such that a line segment will pass through all of the heads. Moreover, the heads are arranged vertically on the head assembly such that the line segment is parallel to the actuator axis. Although the flexures can flex and thereby permit individual heads to move vertically relative to the other heads on the head assembly, the relative physical sequence of the heads is fixed.

On a typical head assembly, each of the heads is connected via a set of wires carried along its corresponding flexure, to a flex strip mounted on the actuator. Each wire is soldered to a respective pad on the flex strip. For a given one of the heads, the set of electrical conductors beyond the solder joints is referred to herein as a "lead set" for the given head. In the embodiments described herein, the lead sets comprise conductors on the flex strip.

The flex strip on the actuator supports an "actuator chip" which performs, among other things, signal preamplification and, in many cases, head biasing, fault protection and multiplexing. The flex strip further has an electrical connector mounted thereon, for further connection to the disk drive electronics.

Older magnetic heads were inductive, and each head had two wires to be soldered to the flex. Newer magnetic heads are magneto-resistive (MR), and each head has four wires—two for reading and two for writing. In both cases, the individual wires are extremely tiny. They are so small, in fact, that they typically must be soldered to the flex strip by hand, under a microscope. In this situation, it is unfortunately very easy to interchange the different wires for a given head, or among different heads. The situation is more problematical with MR heads than with the older inductive heads, because of the greater number of wires that need to be soldered for each head.

Because of the risk of inaccurate lead attachment, manufacturers of head assemblies have developed fixtures and techniques for statically testing head assemblies before they are mounted in disk drives. In one such technique, the head assembly is mounted in a fixture which includes a number of different electromagnetic coils. The coils are excited with a high-frequency AC current, and are distributed in space in such a way as to produce a high-frequency magnetic field having a known phase distribution throughout the spatial region containing the heads. Each head receives a high-frequency magnetic field of approximately the same amplitude, but with different phases. By comparing the phase of the electrical signal produced by the lead set which is supposed to be connected to each of the heads, either to the phase of the electrical signal from other lead sets or to the phase of the input excitation current, the tester can determine whether all of the lead sets are actually connected to their proper heads.

The above-described prior art tester was designed for use with inductive heads, however, not MR heads. Whereas inductive heads do have a direction of particular magnetic sensitivity, the direction of particular magnetic sensitivity for MR heads is much more narrowly confined because of heavy magnetic side-shielding. The electromagnetic coils in the prior art apparatus were located on the side of the heads, rendering it extremely difficult to produce sufficiently large magnetic field vector components that are aligned with the direction of particular magnetic sensitivity of MR heads. In some cases, in fact, in order to obtain meaningful electrical output from the lead sets of MR heads, it might be necessary to increase the current levels applied to the coils by such an amount that the resulting magnetic fields exceed the maximum safe field specification for the MR heads.

Disk drives are being manufactured today in enormous volume, and the magnetic head assemblies for such disk drives need to be manufactured in equally high volume. At the same time, competition among disk drive manufacturers constantly pressures them to keep their production costs low. One way to minimize costs is to detect assembly errors while the head assembly is still on the production line, before it is mounted in a disk drive. If an error is detected while the head assembly is still on the production line, then the error can be corrected much more easily and inexpensively. For one easily arising form of error, that of incorrect attachment of tiny wires to pads on a flex strip, manufacturers in the past had techniques (for example, the technique described above) for detecting these errors on the production line. But now that most disk drives use MR heads as opposed to inductive heads, the prior art no longer teaches any adequate way to test for incorrect lead attachment while the head assembly is still on the production line.

SUMMARY OF THE INVENTION

In order to understand the invention, reference will be made to a hypothetical fixture and several computer simulations. FIG. 1 illustrates a cylindrical electromagnetic 110, and we are interested in the magnitude of the magnetic flux density vector $B_1(x)$ along the axis 112 of the magnet 110. The flux density of the field B at the end of the cylinder is proportional to the electrical current through the coil 114, and if the current is constant, the field B decreases with increasing distance x along the axis 112. The actual dependency of B versus x may differ for different electromagnet shapes and sizes, but it is important only that (1) the function B(x) monotonically decreases with increasing x, and for any fixed distance x, the magnetic field B is proportional to the coil current. FIG. 2 shows curves for $B_1(x)$ for two different values of coil current I. For curve 210, the coil current is illustratively 100 milliamps, whereas for curve 212, the coil current is illustratively 50 milliamps.

FIG. 3 illustrates an arrangement having the cylindrical electromagnet 110, and also a second cylindrical electromagnet 310 having an axis aligned with the axis 112 of the cylindrical electromagnet 110. The coils are wound, and the current is applied, such that the magnetic field direction produced by the magnet 310 along the axis 112 is opposite to the magnetic field direction produced by the magnet 110. FIG. 4 is a computer simulation showing the magnetic fields produced by the electromagnets 110 and 310, for equal currents flowing in both coils. In particular, curve 410 illustrates a magnetic field $B_1(x)$ produced by the electromagnet 110, and curve 412 illustrates the field $B_2(x)$ produced by the electromagnet 310. Curve 414 illustrates the sum of the two fields along the axis 112, $B(x)=B_1(x)+B_2(x)$. In these figures and in the remaining illustrative figures, distance x is considered measured from left to right, for all magnetic field curves, with the end of cylinder 110 facing cylinder 310 being defined as 0 mm and the end of cylinder 310 facing cylinder 110 illustratively disposed at x=20 mm. It can be seen in FIG. 4 that at the midpoint between the two electromagnets 110 and 310 (that is, at x=10 mm, the magnitude of the magnetic field along the axis 112 is 0 (null).

FIG. 5 illustrates how the curves change when the current in the coil of magnet 110 is increased by 25% and the current in the coil of magnet 310 is decreased by 25%. Again, curve 510 illustrates the magnitude of the magnetic field $B_1(x)$ produced by the magnet 110; curve 512 illustrates the field $B_2(x)$ produced by electromagnet 310, and curve 514 illustrates the sum curve, $B(x)=B_1(x)+B_2(x)$. As can be seen, the zero field point in this situation has been shifted toward the electromagnet 310, and is now at x=11.5 mm.

The drawings of FIGS. 3–5 illustrate that by changing the current flowing through the coils of both electromagnets 110 and 310, the zero magnetic field point in the space between the two magnets can be shifted along the axis 112. In addition, it will be appreciated that whereas the above example uses DC current levels producing constant magnetic fields, the same result can be achieved by exciting the coils with an AC current and controlling the amplitude of each coil's current. In either type of system, a magnetic null or zero can be detected with a magnetically sensitive element placed at the appropriate location along the axis 112. It will also be appreciated that the zero magnetic field point on the axis 112 is actually only one point in an entire plane (perpendicular to the axis 112) of points having a zero magnetic field. Thus a zero magnetic field at a particular point $x_0$ on the axis 112 can be sensed by a sufficiently magnetically sensitive element located anywhere on the plane. For simplicity, however, the remainder of this discussion will continue to analyze a situation in which current excitation is DC and the magnetic field is sensed by an element located on the axis 112.

Now let us consider the dependency between changing coil current and changing magnetic field strength B at a fixed location x on the axis 112. Suppose first that a current $I_1$ through the coil of electromagnet 110 changes linearly with time from zero to $I_{max}$, and at the same time, the current $I_2$ through the coil of electromagnet 310 changes linearly with time from $I_{max}$ to zero (that is, $I_2=I_{max}-I_1$). At every point x on the axis 112, there is a different superposition of the positive field $B_1(x)$ and the negative field $B_2(x)$. In particular, since $B_1(x)$ is proportional to $I_1$ and $B_2(x)$ is proportional to $I_2$, and both currents $I_1$ and $I_2$ are changing linearly with time, the magnitude of the magnetic field at each point x on the axis 112 will also change linearly with time. Additionally, for each point x, the magnetic field magnitude at the start of the cycle will be different from the magnetic field magnitude at the start of the cycle for all other points x, and the magnetic field magnitude at the end of the cycle will be different from the magnetic field magnitude at the end of the cycle for all other points x. Accordingly, the composite field B(x) will intersect zero at different times for different points x.

Note that the linearity of B with respect to time does not depend on a shape of the B(x) curve. FIG. 6 illustrates the time dependence of B at 11 different positions x in a situation where $B(x)=1/x^2$, and FIG. 7 illustrates the time dependence of B at 11 different positions x in a situation where $B(x)=1/x$. In these two charts, the current through the coils in both cases were assumed to have been changed in twenty equal steps, and the eleven different curves in each figure represent the magnitude of the B field at eleven different points along the axis 112. The eleven different points have a spacing equal to 1/20 of the distance between the magnets, and are grouped in a "working space" around the midpoint between the two magnets 110 and 310. It can be seen that the magnitude of B with respect to time remains linear for all illustrated positions x, and for two significantly different models for the falloff of B with respect to x. Thus the inventive technique will operate correctly for a wide variety of different shapes for the electromagnets 110 and 310. (It is assumed here that the magnets 110 and 310 are not saturated.)

Next, assume that eleven magnetically sensitive elements, for example MR heads, are placed between the two electromagnets 110 and 310, along the axis 112 at the eleven x positions represented in the curves of FIGS. 6 and 7. If the electrical lead sets connected to the different heads are monitored as the current is stepped through the twenty steps, then each lead set will indicate the magnetic field zero (or null) at a different one of the current settings. A conventional polarity detector, or phase detector if AC current excitation is used, can be used to detect the zero field condition on each lead set. Moreover, the sequence with which the different lead sets indicate the presence of a magnetic zero, corresponds to the physical sequence along the axis 112 of the magnetic heads to which the lead sets are connected. Thus, if a lead set is connected to the wrong head, this can easily be determined by out of sequence indication by the different lead sets of the presence of a magnetic zero.

In a practical realization, it is not necessary that $I_2=I_{max}-I_1$, if the relationship between the currents is nevertheless reverse-monotonic. Nor is it necessary that the current through either coil actually change linearly or even monotonically. Practical electromagnets need not be identical, and the region of space at which the magnetically sensitive elements are to be placed need not be located strictly in the middle of the space between the magnets. The magnetically sensitive elements need only be located within a working region of space, the magnetic field at every point within which passes through zero at some time during the test cycle. It is even possible to maintain a constant current through the coil of one electromagnet while the current through the other is varied, or to simply replace one of the electromagnets with a permanent magnet. In this case, however, the magnet producing the varying magnet field should be many times stronger than the magnet producing the constant magnetic field, and to achieve the same reliability of measurement it will be desirable to produce a very strong magnetic field inside the work area. Such a strong magnetic field may not be acceptable for certain MR heads.

Accordingly, roughly described, the invention involves a test method for use with a plurality of magnetically sensitive elements having a fixed relative physical sequence, and with a plurality of electrical lead sets through each of which the magnetic field being experienced by a respective one of said magnetically sensitive elements can be sensed. The method comprises the steps of placing the magnetically sensitive elements in a variable magnetic field and determining a respective magnetic field setting at which each given one of the lead sets indicates the presence of a magnetic null. The results of such a test can be used to determine which lead sets are connected to which magnetic elements, and/or to determine whether at least one lead set is mis-connected.

More specifically related to disk drive heads, if the magnetically sensitive elements comprise disk drive heads attached to an actuator, the invention, again roughly described, involves a method for testing whether sequential ones of the lead sets are connected to sequentially disposed ones of the heads. The method includes steps of placing the actuator between a first electromagnet having a first coil current and a second electromagnet having a second coil current which is reverse-monotonically related to the first coil current, such that the heads are disposed along a line passing through the first and second electromagnets, and for a first one of the lead sets expected to correspond with a first one of the heads, applying a plurality of different test current settings as the first coil current to determine a first setting of the first coil current at which the first lead set indicates the presence of a null magnetic field. For a second one of the lead sets expected to correspond with a second one of the heads disposed more nearly than the first head to the first electromagnet, a plurality of different test current settings are applied as the first coil current to determine a second setting of the first coil current at which the second lead set indicates the presence of a null magnetic field. Then the second setting of the first coil current is compared to the first setting of the first coil current. Since the second setting was taken for a head disposed nearer than the first head to the first electromagnet, the second setting should be smaller than the first setting. Otherwise, one or both of the two lead sets are mis-connected.

In another aspect of the invention, again roughly described, apparatus for testing a magnetic head assembly includes first and second opposing magnetic field sources, at least one of which produces a variable magnetic field, and a fixture capable of holding the magnetic head assembly such that the heads are aligned with a line passing through the two magnetic field sources. If the two magnetic field sources include electromagnets, then the apparatus can further include a controller which, for a first one of the lead sets expected to correspond to a first one of the heads, applies a plurality of different test current settings as the first coil current to determine a first setting of the first coil current at which the first lead set indicates the presence of a null magnetic field. For a second one of the lead sets expected to correspond with a head disposed more nearly than the first head to the first electromagnet, the controller applies a plurality of different test current settings as the first coil current to determine a second setting of the first coil current at which the second lead set indicates the presence of a null magnetic field. Again, since the second setting was taken for a head disposed nearer than the first head to the first electromagnet, the second setting should be smaller than the first setting. Otherwise, one or both of the two lead sets are mis-connected.

BRIEF DESCRIPTION OF THE DRAWINGS

The invention will be described with respect to particular embodiments thereof, and reference will be made to the drawings, in which.

DETAILED DESCRIPTION

Figure 1:
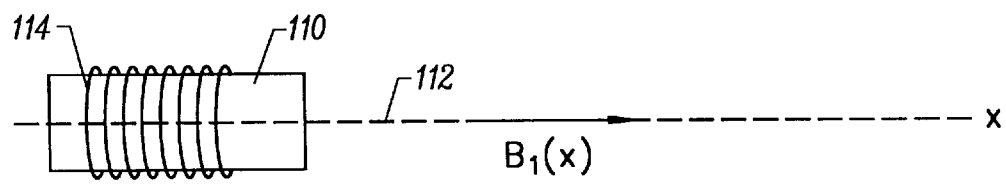
FIGS. 1 and 3 illustrate hypothetical fixture arrangements.
Figure 2:
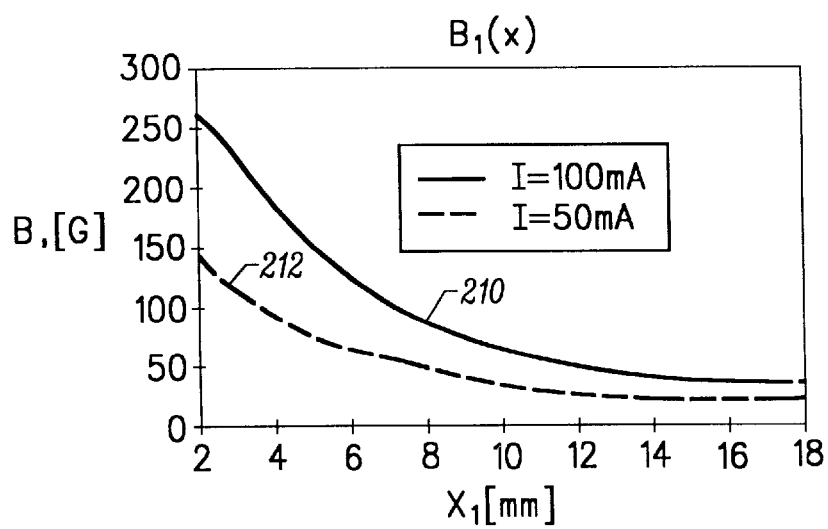
FIGS. 2 and 4–7 illustrate magnetic flux density curves for the arrangements of FIGS. 1 and 3.
Figure 3:
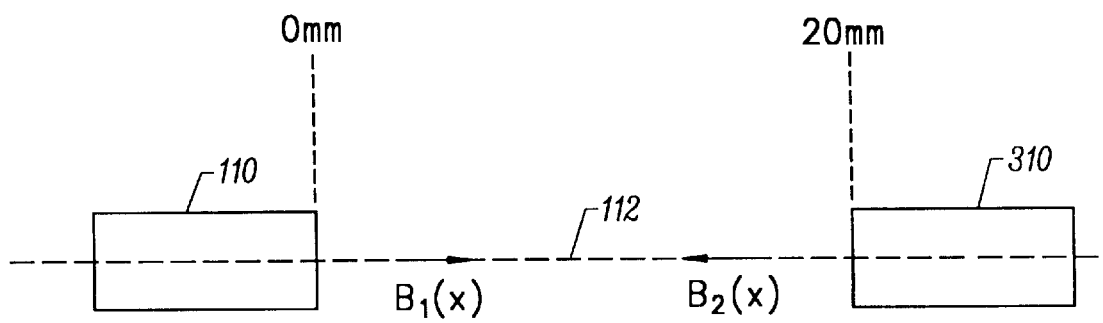
Figure 4:
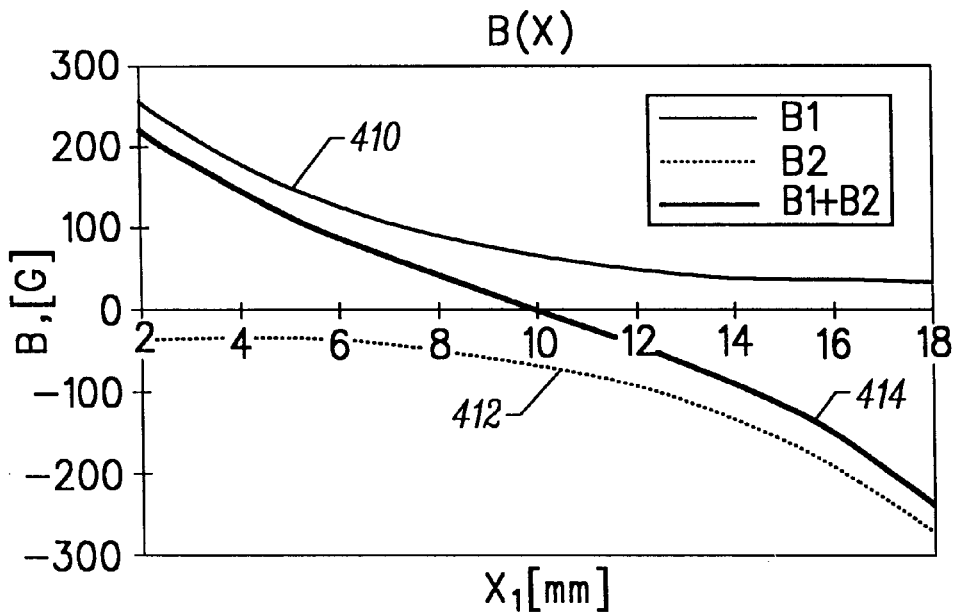
Figure 5:
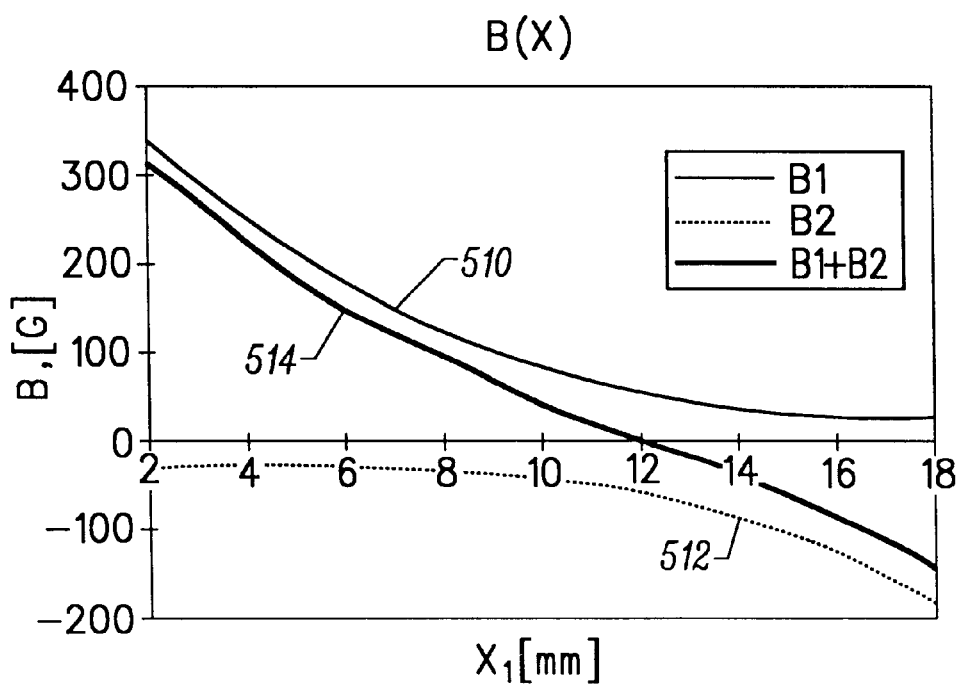
Figure 6:
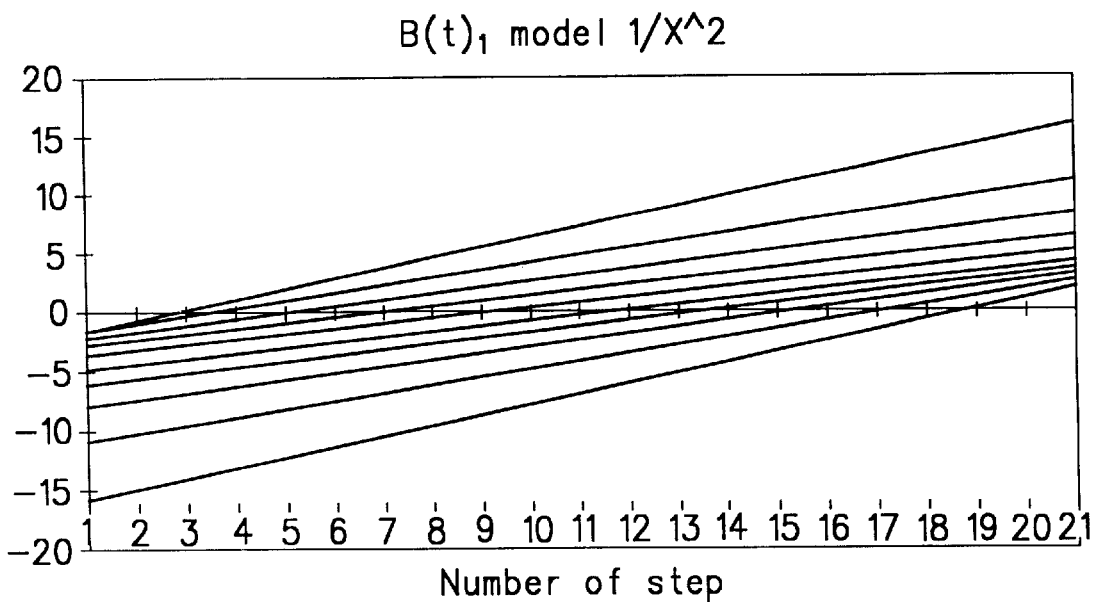
Figure 7:
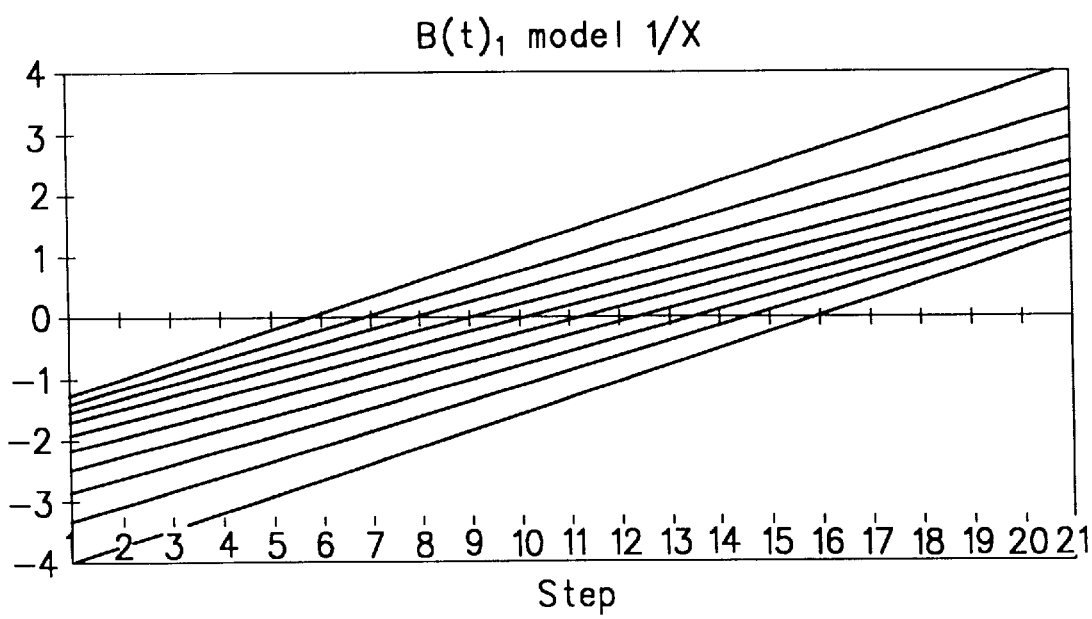
Figure 8:
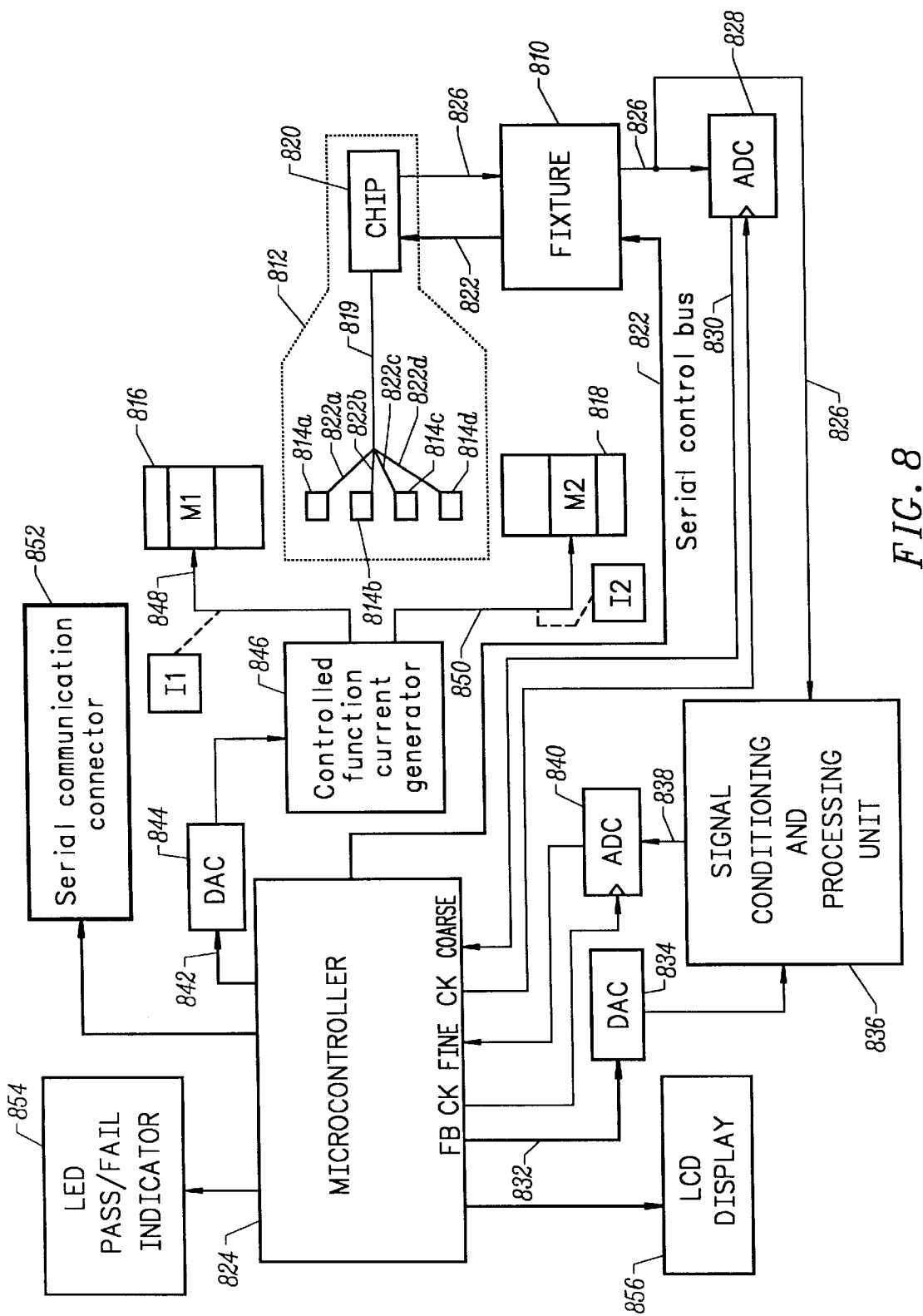
FIG. 8 is a simplified block diagram of a Static Actuator Tester according to the invention.

FIG. 8 is a simplified block diagram of a Static Actuator Tester (SAT) for performing a number of different tests on magnetic head assemblies, including a "head unique test"—the detection of the correct order of electrical lead connections from the different heads. Components of the SAT not used for the head unique test are omitted from FIG. 8 for simplicity of illustration.

Referring to FIG. 8, the SAT comprises a fixture 810 on which a Device Under Test (DUT), specifically a magnetic head assembly 812, is mounted. The head assembly 812 supports a number of magneto-resistive heads, four of which (814a, 814b, 814c and 814d, collectively 814) are shown in FIG. 8. The fixture 810, after the head assembly 812 is in place, holds it such that the heads 814 are arranged linearly along a line passing through a central axes of two opposing cylindrical electromagnets 816 and 818. The heads 814 are disposed "substantially" linearly with each other, meaning they can be nonlinearly disposed by small amounts, such as manufacturing tolerances. Additionally, as used herein, when it is said that the heads are placed "between" two magnetic field sources, they need not be placed exactly along a line passing through the two magnetic field sources. It is sufficient only that they be disposed between two parallel planes, each passing through a respective one of the magnetic sources, and both perpendicular to a line passing through both magnetic sources.

The magnetic heads 814 are connected to a flex strip 819 via respective sets 822a, 822b, 822c and 822d (collectively 822) of electrical wires, each including four electrical wires. Two of the wires for each head are for reading, while the other two are for writing. It is the solder connection of these wires to the individual conductors on the flex strip 819 which is the subject of the test described herein.

Also soldered to the flex strip 819 is an actuator chip 820. The actuator chip 820 can be, for example, a model TLS24508DBT, manufactured by Texas Instruments, Inc. It is described in Texas Instruments, "TLS24508DBT (MAXTOR) 8 Channel Magneto-Resistive/Thin Film Read/Write Preamplifier," Preliminary Specification, Rev. 0.2 (March 1996), incorporated by reference herein. This actuator chip supports up to eight MR heads. In the read channel, one of the read conductors in the lead set is connected to ground and the other is connected to a positive single-ended input pin of the chip 820. The signal is then (among other things) preamplified, high pass filtered, and multiplexed to a differential pair RDX/RDY of read output pins on the chip 820. The signal from the positive single ended input pin is also buffered and amplified by a factor of five, and without high pass filtering, is multiplexed to a "Buffered Head Voltage" (BHV) output pin of the chip 820. In an embodiment of the invention utilizing high frequency AC fields, it might be appropriate to monitor the RDX/RDY differential read channel output. But for the present embodiment, which utilizes DC magnetic fields and DC current excitation of the electromagnet coils, the desired signals would not pass through the high pass filter. In the present embodiment, therefore, it is the BHV output which is monitored rather than the RDX/RDY output.

The chip 820 further has a serial control port for which 8-bit control words are read and written. A control word is written to the chip 820 by toggling an SCLK input and synchronously providing eight bits serially, made up of two register address bits followed by six data bits. Numerous parameters of the chip 820 are programmable in this manner, including head select (which controls the multiplexing of the BHV and RDX/RDY outputs, among other things), and bias current for the then-selected head.

The bias current multiplied by the resistance of the MR element on the head, produces a bias voltage that appears on the BHV output. The bias voltage as it appears on the BHV output is on the order of 2.5 V, which far exceeds the typical variation of only a few millivolts or less which is due to the electromagnets 816 and 818. Part of the task of the circuitry in the SAT is to subtract out the bias voltage to reveal the signal variations caused by the electromagnets 816 and 818. In addition, because the bias current output is guaranteed only within a tolerance of ±5%, and because the resistance of the MR element on different heads varies greatly, it will be appreciated that the steady state voltage output on the BHV pin of chip 820 can vary greatly both head-to-head and over time. These variations, too, are eliminated or accommodated by the remainder of the circuitry in the SAT.

The serial control bus is indicated in FIG. 8 as bus 822. It is driven by a microcontroller 824 through a connector on the fixture 810. The BHV output of the integrated circuit chip 820 is 826 in FIG. 8, and is provided through a connector on the fixture 810 to an Analog to Digital Converter (ADC) 828. ADC 828 has a 12-bit digital output, representing approximately 2.5 millivolts per step. This output is provided to the microcontroller 824 as a Coarse data input, via a bus 830. The microcontroller 824 has a feedback output 832 which is provided to the digital input port of a Digital to Analog converter (DAC) 834. The analog output of DAC 834 is connected to one input of a signal conditioning and processing unit 836. The processing unit 836 also receives the analog buffered head voltage from the integrated circuit chip 820. The processing unit 836 noise reduces the BHV signal and subtracts out the voltage from the DAC 834, providing a resulting signal output on a line 838 to a second ADC 840. The signal on line 838 now carries the magnetic field information from the magnetic heads 814, with the bias voltage and most noise eliminated. The ADC 840 converts the signal from line 838 into digital form, with a step size that is much smaller than that of ADC 828, and provides it to a Fine input of the microcontroller 824. The microcontroller also drives the clock lines to signal the two ADCs 828 and 840 to sample their respective analog input voltages.

The microcontroller 824 further has a digital output port 842 connected to the digital input port of a DAC 844. The analog output of DAC 844 is provided to a controlled function generator 846. The function generator 846 has two current outputs: current output 848 drives the coil of electromagnet 816 with a current $I_1$, whereas the current output 850 drives the coil of the electromagnet 818 with a current $I_2$. As set forth in more detail below, under control of the microcontroller 824 through DAC 844, in a typical embodiment, the function generator 846 steps monotonically through a cycle of current steps for its output $I_1$, and reverse monotonically for its output $I_2$.

The microcontroller 824 further has a serial port connected to a serial communication connector 852, which is used for communicating with other computer systems. The microcontroller 824 also has an output connected to a pass/fail indicator LED 854, which it can use to indicate whether the head unique test passed or failed for a given head assembly. The microcontroller 824 further has an output connected to an LCD display for displaying detailed information about the test results.

The microcontroller 824, through its clock outputs to the ADCs 828 and 840, triggers them to sample their respective input voltages at a time which is sufficiently delayed after each current step output of the function generator 846 to allow the magnetic fields within the working region to stabilize, but sufficiently early to avoid low frequency noise that tends to appear on the head bias voltage soon after a current step. The noise reduction that takes place in the processing unit 836 on the BHV signal 826, also attempts to filter out voltage bias variations.

To further reduce noise, the microcontroller 824 collects the Fine data input for a full cycle of current steps before determining the zero crossing point. In another embodiment, the microcontroller 824 could instead simply detect in real time the particular current step at which the Fine data input crosses the zero voltage point, but reliability is improved by collecting the full set of data points before making this determination. Specifically, after all the data points are collected for a head, the microcontroller 824 recalculates each point as the moving average of three data points from the Fine input data. This or another digital filtration technique is desirable in order to further reduce the influence of noise. Even if the digital filtration technique produces a shift in the calculated zero crossing, the sequence of current steps at which the zero crossing is discovered for different heads should nevertheless remain constant.

Figure 9:
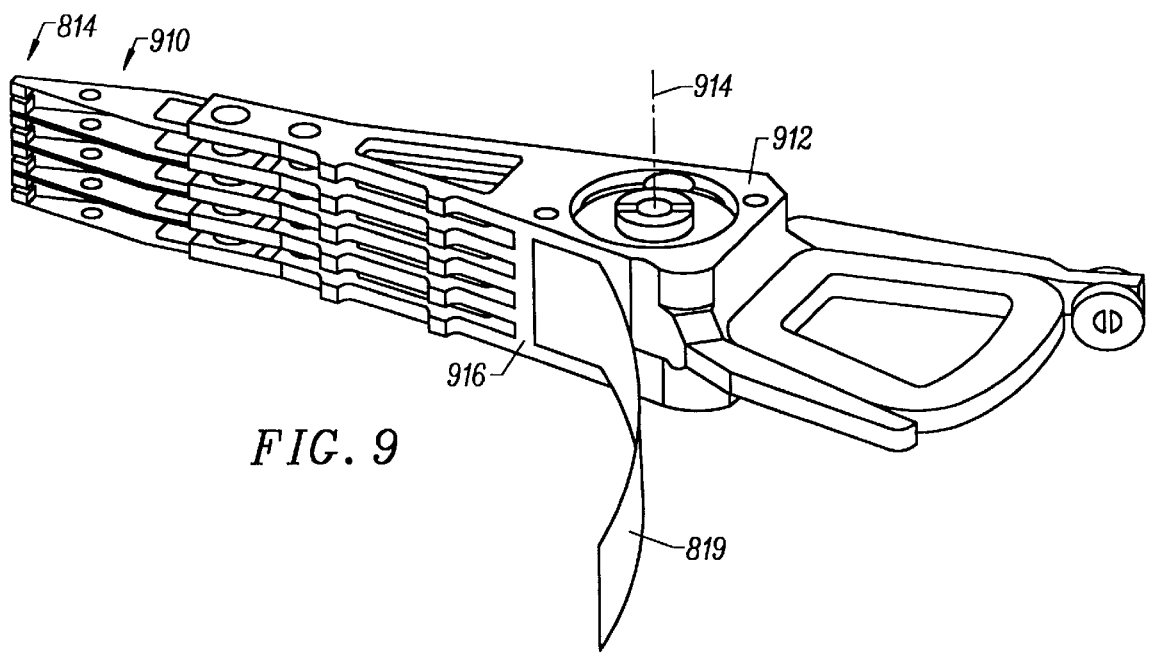
FIG. 9 is a perspective view of a typical magnetic head assembly which can be used with apparatus according to the invention.

FIG. 9 is a perspective view of a typical magnetic head assembly which can be used with apparatus according to the invention. This is an eight-head assembly, but it will be understood that other assemblies having as few as two or as many as twelve or more heads can be used. The heads 814a, 814b, 814c and 814d are attached to the ends of respective flexures 910 extending radially outward from the actuator 912. When mounted in a disk drive, the actuator pivots about pivot axis 914. The flex strip 819 can be seen attached to the side 916 of the actuator 912.

Figure 14:
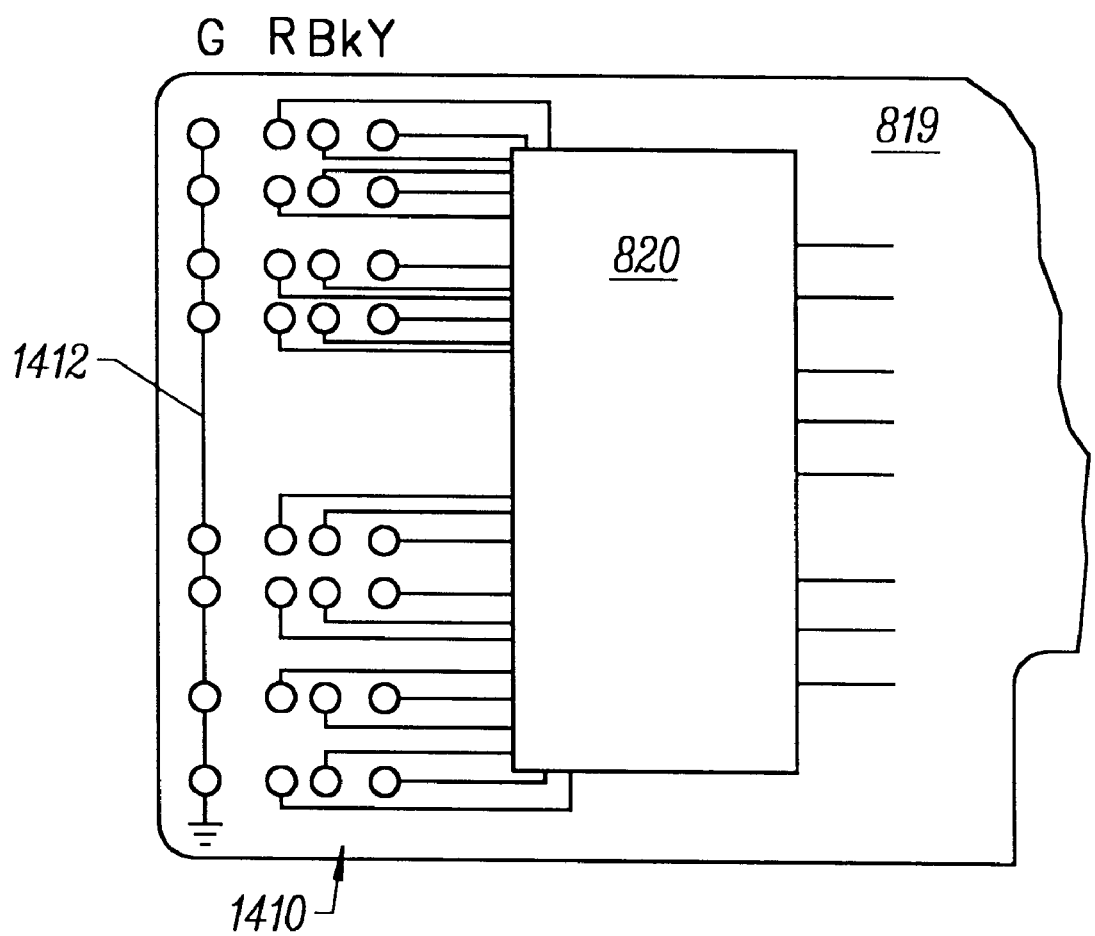
FIG. 14 is a detail of the flex strip of FIG. 9.

FIG. 14 is a detail of a portion of the flex strip 819 mounted on the side 916 of the actuator 912. It has 32 solder pads arranged in an array 1410 of eight rows and four columns. Each row corresponds to a respective one of the heads. The four wires from a head are color coded such that they should always be soldered to the pads in a predefined color-order, left to right. The color coding simplifies visual detection of connection errors among the different wires of a single head, but does not help avoid connection errors among the different wires of different heads. Each of the solder pads on the flex strip 819 is further connected on the flex strip via a respective conductor. The conductors from three of the solder pads in each row make electrical connection with a respective pin on the actuator chip 820, and the fourth makes electrical connection with a ground conductor. All four conductive paths on the flex strip 819 for a given row of the solder pads 1510 are considered herein to be part of the "lead set" to be connected to a corresponding one of the heads 814.

Figure 10:
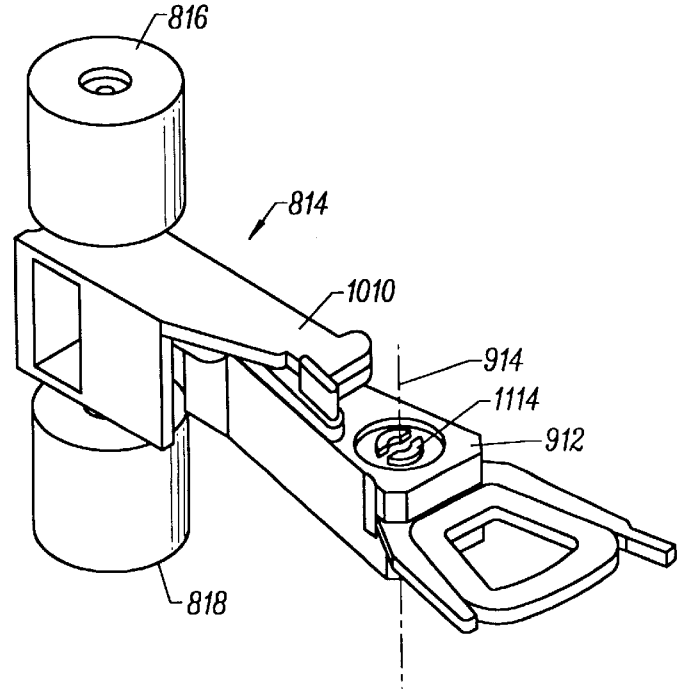
FIGS. 10 and 11 are perspective views of certain components of apparatus according to the invention.

FIG. 10 is a perspective view of certain components of the SAT apparatus, illustrating the position of the heads 814 relative to the electromagnets 816 and 818. The electromagnets 816 and 818 are cylindrical and coaxially aligned. The heads 814 themselves are hidden by a cover 1010 in FIG. 10, but they are linearly arranged along the axes of the two electromagnets 816 and 818.

Figure 11:
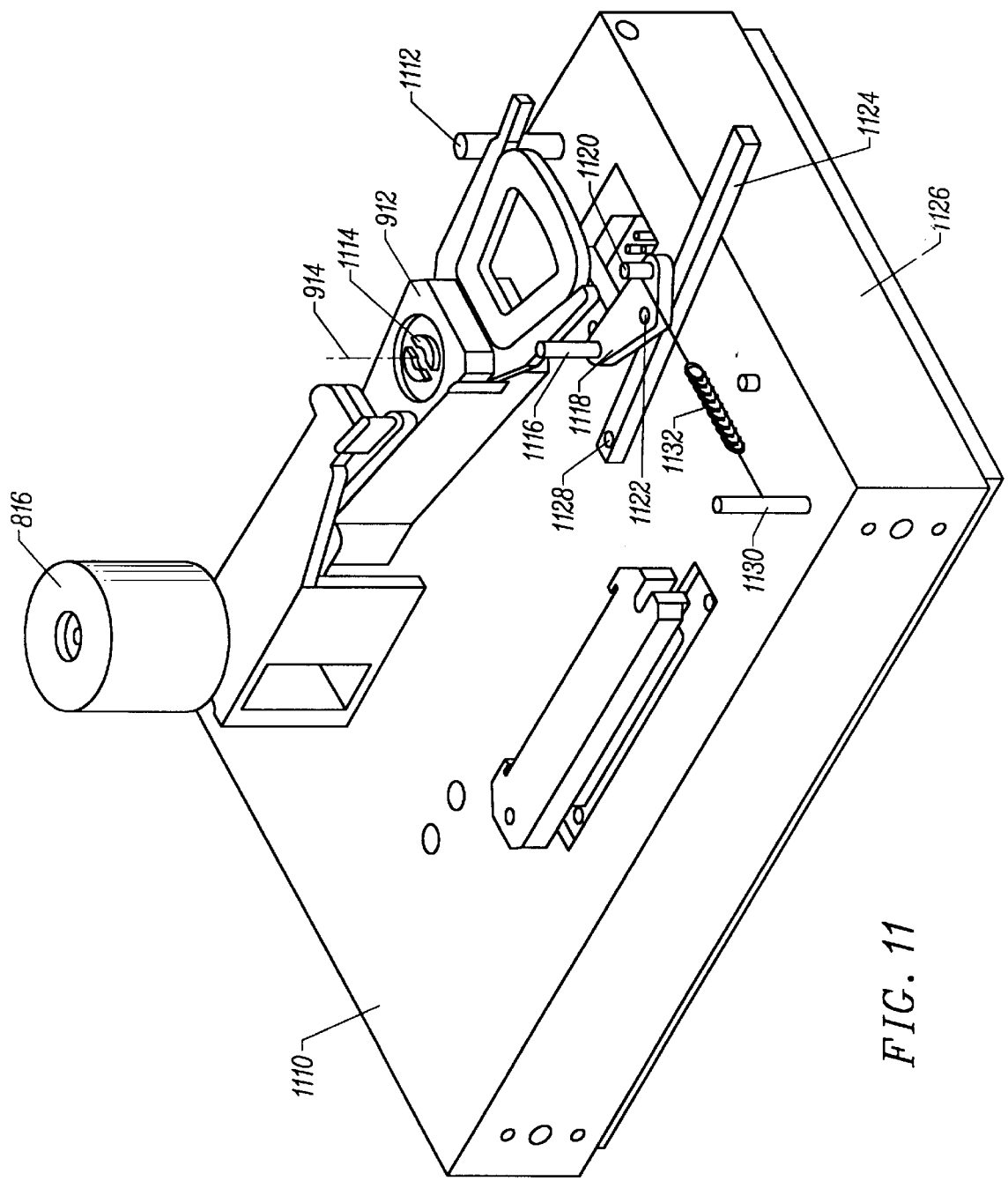

FIG. 11 adds additional tester apparatus components to those of FIG. 10, including a base 1110 and a stopper pin 1112 extending vertically upward from the base 1110. The actuator 912 is pivotably attached to the base 1110 at the axis 914, preventing any translational movement of the head assembly during testing. The stopper pin 1112 is positioned on one side of the actuator 912 in order to stop any counterclockwise (as viewed from above) rotation of the actuator 912 beyond a certain point. The fixture also includes a stopper pin 1116 on the opposite side of the actuator 912, but the stopper pin 1116 is mounted on a separate flange 1118 rather than directly on the base 1110. The flange 1118 has a triangular shape with the stopper pin 1116 extending perpendicularly to the plane of the triangle from one vertex thereof. An additional vertical post 1120 extends upward from a second vertex of the triangle, and the third vertex, 1122, is pivotably attached to approximately the midpoint of an arm 1124. One end of the arm 1124 extends forward beyond the front 1126 of the base 1110, and the other end of the arm is attached pivotably at a point 1128 to the top surface of the base 1110. Another post 1130 extends vertically upward from the top surface of the base 1110, and an extension spring 1132 is connected between the post 1120 on the flange 1118 and the post 1130 on the base 1110.

In operation, a head assembly can be installed into the fixture when the arm 1124 is rotated clockwise away from the actuator 912. In this position, the stopper pin 1116 is not in contact with the head assembly, and the spring 1132 is able to pull the post 1120 such that the flange 1118 rotates about pivot point 1122 to its stopping position. After the head assembly has been installed into the fixture, the arm 1124 is manually rotated counterclockwise about its pivot point 1128. As the stopper pin 1116 comes into contact with the side of the actuator 912, and the arm 1124 continues to rotate, the flange 1118 beings to rotate counterclockwise about its pivot point 1122 relative to the arm 1124. The arm 1124 eventually reaches its closed position, at which it is locked into place by means not shown. In this position, the arm 1124 is stationary relative to the base 1110, and the spring 1132 is pulling the post 1120 on the flange 1118 toward the post 1130 on the base 1110. The tension of the spring 1132 tends to try to rotate the flange 1118 clockwise relative to the base, thereby urging stopper pin 1116 against the side of the actuator 912. Thus, whereas stopper 1112 prevents counterclockwise rotation of the head assembly, stopper pin 1116 prevents clockwise rotation of the head assembly about the actuator pivot axis 914. Thus, the heads 814 are maintained in careful alignment with the axes of the cylindrical electromagnets 816 and 818. Note that in another embodiment, it is not essential that the heads be exactly aligned with such axis. It will be appreciated that the opposing magnetic fields generated by the two electromagnets have both a magnitude and a vector direction at each point in the working region of space, and if the direction of particular magnetic sensitivity of the heads is very narrow, then the heads may still be able to detect a null magnetic field wherever the sum of the vector components, taken in the direction of particular magnetic sensitivity of the head, is zero. In practice, for many kinds of heads, the magnetization of ferromagnetic material in the head's body will disturb the magnetic field in a nearby region of space if they are not aligned with the axis. Such disturbances could change the results of the measurements. It is therefore desirable to align the heads with the axis as nearly as possible, although exact alignment is not essential.

Figure 12:
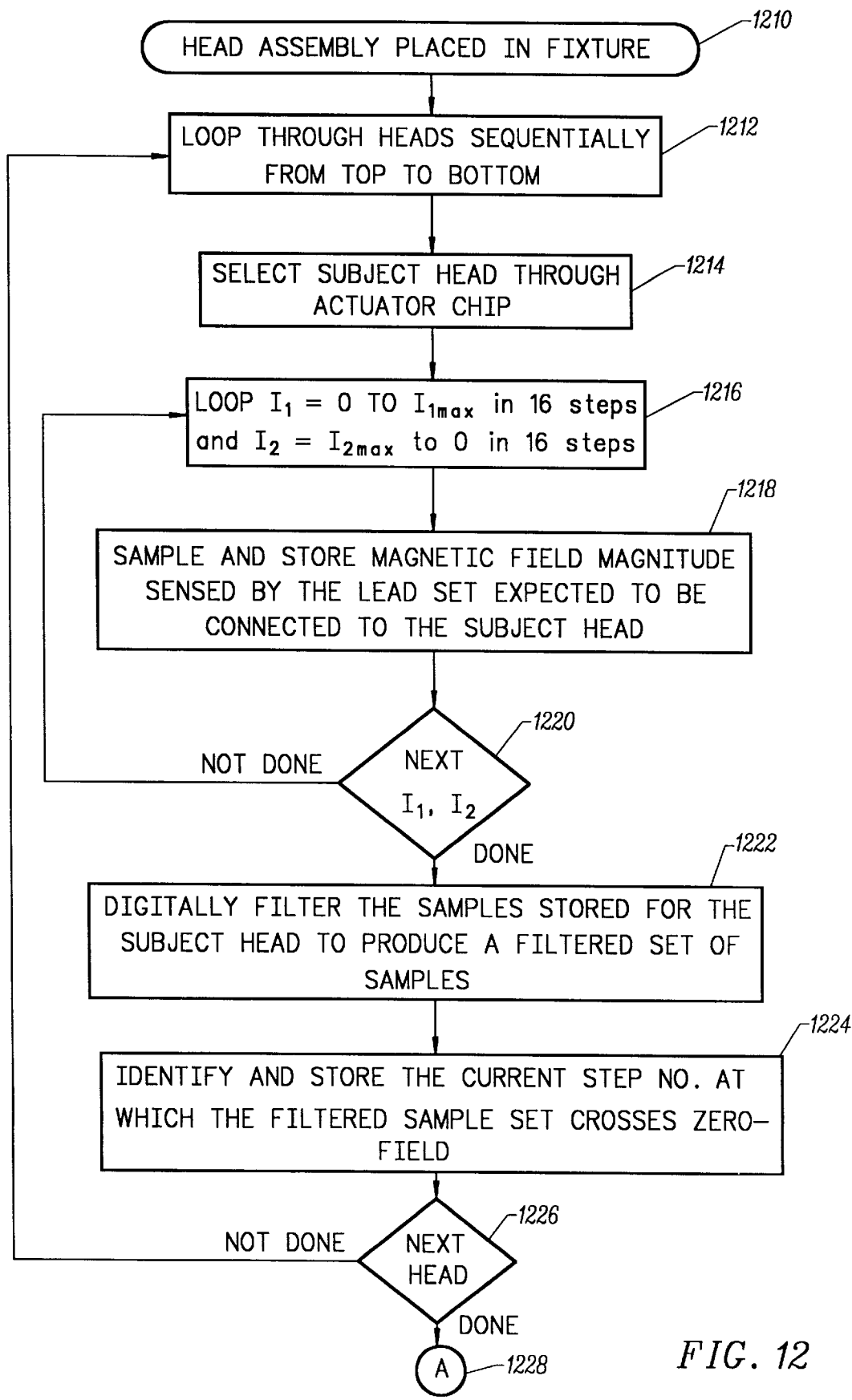
FIG. 12 is a flow chart illustrating a typical method of operation of the system of the present embodiment.

FIG. 12 is a flow chart illustrating a typical method of operation of the system of the present embodiment. In a step 1210, a head assembly is placed into the fixture of FIG. 11. In a step 1212, the microcontroller 824 begins a loop through all of the heads on the head assembly, sequentially from top to bottom. It will be appreciated that in another embodiment, this loop need not proceed top to bottom, nor must it even proceed through the heads sequentially, if the zero crossing current step numbers are stored and not examined for sequence until this loop finishes all heads. Proceeding sequentially, however, is conceptually easier to understand.

For each subject head in the loop, in step 1214, the microcontroller programs the serial control registers of the actuator chip 820, using serial control bus 822, to set the read mode of the chip, to set the bias current, and so on, and to select the subject head. In step 1216, the microcontroller 824 performs an inner loop of current steps for testing the subject head. Specifically, it causes the function generator 846 to cycle through sixteen current steps for $I_1$ from zero to a maximum $I_{1max}$. At the same time, it causes $I_2$ to loop through sixteen current steps in the opposite direction, from $I_{2max}$ to zero. $I_{1max}$ an $I_{2max}$ can be equal in some embodiments, but in the present embodiment, they are set separately for each coil. The current steps in the present embodiment are linear, but it will be appreciated that current step linearity is not required in another embodiment. A more general description of a current step sequence which can be used in an embodiment of the invention, is to allow $I_1$ to progress from $I_{1min}$ to $I_{1max}$ in N steps while $I_2$ progresses from $I_{2max}$ to $I_{2min}$ in N steps. Preferably, at least, $I_2$ is stepped in a reverse-monotonic relationship with $I_1$.

As used herein, two variables have a "reverse-monotonic" relationship if one variable increases as the other decreases, and visa versa. Two variables have a "forward-monotonic" relationship if one variable increases as the other increases, and decreases as the other decreases. The term "monotonic" includes both "forward-monotonic" and "reverse monotonic". It will be appreciated further that the current steps produced in the loop 1216 need not even be monotonic since, as will be seen below, samples for all the current steps in the cycle are collected before any determination is made of the zero crossing. Thus, all current steps are included in the loop in these embodiments, but it is not necessary that they be produced monotonically.

In a step 1218, the apparatus of FIG. 8 samples and stores the magnetic field magnitude sensed by the lead set which is expected to be connected to the subject head. While the outer loop 1212 can be thought of as progressing through the heads sequentially, the actual progression is through the lead sets which are expected to be connected to sequentially positioned heads. That is, the actual progression is through the lead sets which would be connected to sequentially positioned heads if all connections were made properly. The apparatus of the present embodiment detects magnetic field zero crossings as reported by the lead sets; the physical sequence of lead sets matches the physical sequence of heads only if the leads were all attached to the heads correctly.

In step 1220, the microcontroller 824 loops back to step 1216 for the next current step in the cycle.

In step 1220, if the loop 1216 has completed, then control transfers to step 1222, in which the microcontroller 824 digitally filters the samples that were stored in step 1218 for the subject head. A new, "filtered" set of samples is produced. In step 1224, the microcontroller 824 identifies the current step number (from the loop 1216) at which the filtered sample set crosses the zero-field mark. The microcontroller 824 then stores such zero crossing current step number in correspondence with the head number of the subject head. In step 1226, control loops back to step 1212 to perform the same current stepping through the next head in sequence. At the conclusion of the loop 1212, at point 1228 in the flow chart, the microcontroller 824 has a correspondence stored in memory between the head number on one hand, and the current step number at which the lead set which is expected to be connected to that head, sensed a zero-crossing of the magnetic field. As used herein, a lead set can "indicate the presence of a predefined magnetic field density" by indicating a crossover from below the predefined density to above the predefined density or vice-versa, at two adjacent magnetic field settings. The phrase does not require that the lead set indicate the exact magnetic field setting at which the magnetic field density sensed at the head is equal to the predefined density.

It will be appreciated that step 1224, of identifying the storing the zero crossing current step numbers for a given head, need not be performed within the loop 1212. Instead, if all of the samples for all of the heads are stored in memory, the step 1224 can be performed for all of the heads after step 1226. Similarly, the digital filtering step 1222 can also be postponed until after step 1226 if all of the unfiltered samples for all of the heads are stored until that time.

If the correspondence stored in memory at point 1228 in the flow chart is sorted by zero-crossing current step number, then the resulting sequence of head numbers would indicate the sequence with which the lead sets are actually connected to the heads. However, if all that is desired is to determine whether any one lead set is misconnected, then sorting is not necessary. The test can be completed as shown in FIG. 13.

Figure 13:
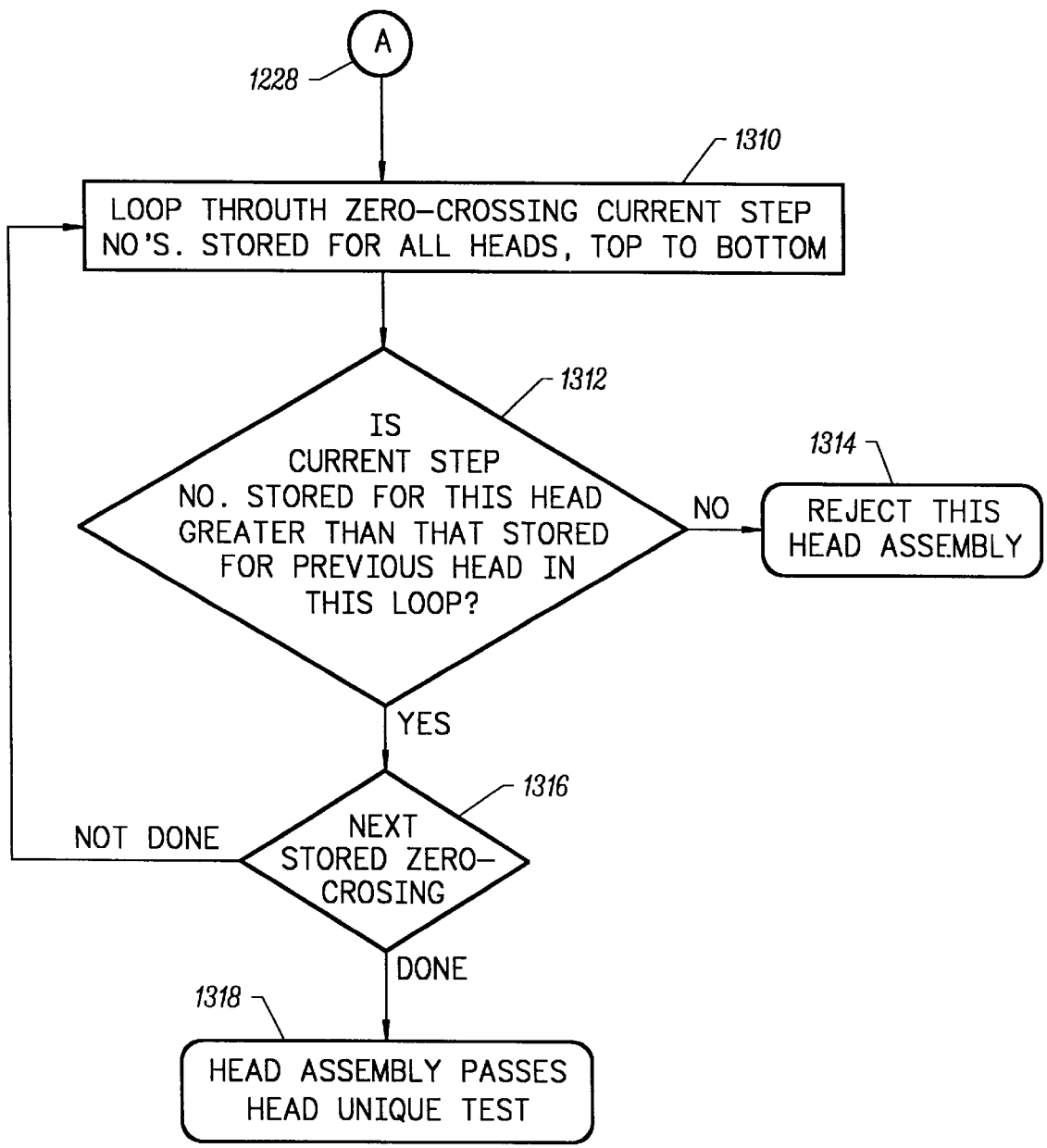
FIG. 13 is a flow chart illustrating a typical method completing the method of FIG. 12.

Referring to FIG. 13, after point 1228 (FIG. 12), in step 1310, the microcontroller 824 loops through all of the heads, top to bottom. The zero-crossing current step number stored for each head is examined. In step 1312, it is determined whether the zero-crossing current step number stored for the head currently being considered in the loop 1310, is greater than the zero-crossing current step number stored for the head previously considered in this loop. (Obviously this step can be skipped for the first head in the loop 1310). If not, then in step 1314, the head assembly is rejected due to a misconnection of the lead sets. The rejection can be indicated in a number of conventional ways, for example, by lighting the pass/fail indicator LED 854 (FIG. 8) and specifying in the LCD display 856 that the head stack failed the head unique test. Optionally in a given embodiment, the loop 1310 can continue to completion, so that the LCD display 856 can specify all of the misconnected heads. If the zero-crossing current step number stored for the head currently being considered in the loop 1310 is in fact greater than that stored for the previous head in the loop, then in step 1316, the microcontroller 824 returns back to step 1310 to continue the loop. At the end of the loop, if step 1314 was never reached, then the head assembly in the fixture 810 has passed the head unique test (step 1318).

It will be appreciated that instead of performing the test 1312 in a separate loop after all the data has been taken, the test of step 1312 can instead be performed within the outer loop 1212 (FIG. 12), between steps 1224 and 1226. In this manner the test sequence might be terminated early if a lead set is found to be misconnected. The test can also be performed inside the inner loop 1216, between steps 1218 and 1220. In one such embodiment, the loop 1216 continues for only two steps after a polarity reversal is detected in the lead set output prior to digital filtration. The curve is then filtered and the exact zero-crossing point is calculated. In another embodiment, the current I, is increased in large steps until a polarity reversal is detected, and then decreased in small steps until the polarity reverses again. (The current $I_2$ is varied reverse-monotonically with $I_1$.) Numerous other variations are possible.

The flow chart of FIG. 12 includes an outer loop 1212, progressing through all of the heads in the head stack, and an inner loop 1216, progressing through all of the current steps for each head. The entire cycle of current steps is completed before the outer loop 1212 progresses to the next head. In an alternative embodiment, the outer loop cycles through all of the current steps, and the inner loop cycles through all of the heads. The method of FIG. 12 is preferred, because there is a relatively lengthy delay each time a different head is selected through the actuator chip 820. This delay is significantly longer than the time delay required to change the magnetic field produced by the electromagnets 816 and 818 to the next step. Nevertheless, the alternative embodiment is also possible.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, in addition to the variations set forth above, embodiments of the invention can use more than two magnetic sources. As another example, a predetermined magnetic flux density other than zero can be used as the value to be sensed for each head. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. A test method for use with a plurality of magnetically sensitive elements having a fixed relative physical sequence, and with a plurality of electrical lead sets through each of which the magnetic field being experienced by a respective one of said magnetically sensitive elements can be sensed, comprising the steps of:

placing said magnetically sensitive elements in a variable magnetic field; and determining a respective magnetic field setting at which each given one of said lead sets indicates the presence of a predetermined magnetic flux density.

2. A method according to claim 1, wherein said predetermined magnetic flux density is zero.

3. A method according to claim 1, further comprising the step of developing a correspondence between said lead sets and said magnetically sensitive elements, at least in part by comparing said magnetic field settings.

4. A method according to claim 1, further comprising the step of failing said plurality of magnetically sensitive elements if the lead sets for which a series of said magnetic field settings was determined in said step of determining, does not match a predetermined desired sequence of said lead sets.

5. A method according to claim 1, wherein said step of placing comprises the step of placing said magnetically sensitive elements between first and second magnetic field sources.

6. A method according to claim 5, wherein said first magnetic field source comprises a first electromagnet having a first coil current, and wherein said step of determining a respective magnetic field setting at which each given one of said lead sets indicates the presence of a predetermined magnetic flux density comprises the step of determining a respective value for said first coil current at which each given one of said lead sets indicates the presence of said predetermined magnetic flux density.

7. A method according to claim 6, wherein said second magnetic field source comprises a second electromagnet having a second coil current which is monotonically related to said first coil current.

8. A method according to claim 1, wherein said step of placing comprises the step of placing said elements in a magnetic field produced by first and second electromagnets, said elements being disposed such that no two of said elements lie in a single plane perpendicular to a line passing through said first and second electromagnets.

9. A method according to claim 8, wherein said magnetically sensitive elements are fixedly positioned relative to each other along a line segment, and wherein said elements are disposed such that said line segment is parallel to a line passing through said first and second electromagnets.

10. A method according to claim 1, wherein said magnetically sensitive elements are fixedly positioned relative to each other along a line segment, and wherein said step of placing comprises the step of placing said elements between first and second electromagnets such that said line segment coincides with a line passing through said first and second electromagnets.

11. A method according to claim 1, wherein said step of determining a respective magnetic field setting comprises the steps of:
    performing an outer test loop through all of said lead sets; and
    for each subject one of said lead sets in said outer test loop, performing an inner test loop through a plurality of test settings of said magnetic field to determine the magnetic field setting at which the subject lead set indicates the presence of said predetermined magnetic flux density.

12. A method according to claim 11, wherein said step of placing comprises the step of placing said magnetically sensitive elements between a first electromagnet having a first coil current and a second electromagnet having a second coil current, and wherein said step of performing an inner test loop through a plurality of test settings of said magnetic field comprises the step of varying at least said first coil current monotonically through a plurality of test settings of said first coil current.

13. A method according to claim 12, wherein said step of performing an inner test loop through a plurality of test settings of said magnetic field further comprises the step of varying said second coil current reverse-monotonically with said test settings of said first coil current.

14. A method according to claim 12, wherein said predetermined magnetic flux density is zero, and wherein said given one of said lead sets indicates the presence of said loop by indicating a magnetic flux polarity reversal.

15. Apparatus according to claim 11, wherein said step of performing an outer test loop through all of said lead sets comprises the step of cycling through all of said lead sets in a sequence that is expected to correspond to said fixed relative physical sequence of said magnetically sensitive elements.

16. A method according to claim 1, wherein said step of determining a respective magnetic field setting comprises the steps of:
    performing an outer test loop through a plurality of test settings of said magnetic field; and
    for each subject one of said test settings; determining which if any of said lead sets indicate the presence of said predetermined magnetic flux density.

17. A method according to claim 16, wherein said step of determining which if any of said lead sets indicate the presence of said predetermined magnetic flux density, comprises the step of performing an inner loop through all of said lead sets to determine which if any of said lead sets indicate the presence of said predetermined magnetic flux density.

18. A method according to claim 1, wherein said magnetically sensitive elements comprise magneto-resistive disk drive heads installed on an actuator.

19. A method according to claim 18, wherein each of said heads has a working surface, and wherein the direction of particular magnetic sensitivity of each of said heads is perpendicular to the working surface of the head.

20. A method according to claim 18, wherein said step of placing comprises the step of arranging said actuator such that the directions of particular magnetic sensitivity of all of said disk drive heads coincide.

21. A method according to claim 1, wherein each of said electrical lead sets comprise two electrical leads.

22. For use with a magnetic head assembly having a plurality of linearly arranged magnetically sensitive heads attached to an actuator, and a plurality of electrical lead sets through each of which the magnetic field being experienced by a respective one of said heads can be sensed, a method for testing whether sequential ones of said lead sets are connected to sequentially disposed ones of said heads, comprising the steps of:
    placing said actuator between a first electromagnet having a first coil current and a second electromagnet having a second coil current which is reverse-monotonically related to said first coil current, such that said heads are disposed along a line passing through said first and second electromagnets;
    for a first one of said lead sets expected to correspond with a first one of said heads, applying a plurality of different test current settings as said first coil current to determine a first setting of said first coil current at which said first lead set indicates the presence of a predetermined magnetic flux density; and
    for a second one of said lead sets expected to correspond with a second one of said heads disposed more nearly than said first head to said first electromagnet, applying a plurality of different test current settings as said first coil current to determine a second setting of said first coil current at which said second lead set indicates the presence of said predetermined magnetic flux density.

23. A method according to claim 22, further comprising the step of comparing said second setting of said first coil current to said first setting of said first coil current.

24. A method according to claim 22, further comprising the step of failing said head assembly if said second setting of said first coil current is not smaller than said first setting of said first coil current.

25. A method according to claim 22, further comprising the steps of:

for a third one of said lead sets expected to correspond with a third one of said heads disposed more nearly than said second head to said first electromagnet, applying a plurality of different test current settings as said first coil current to determine a third setting of said first coil current at which said third lead set indicates the presence of said predetermined magnetic flux density; and comparing said third setting of said first coil current to said second setting of said first coil current.

26. A method according to claim 25, further comprising the steps of:

failing said head assembly if said second setting of said first coil current is not smaller than said first setting of said first coil current; and failing said head assembly if said third setting of said first coil current is not smaller than said second setting of said first coil current.

27. A method according to claim 22, wherein said predetermined magnetic flux density is zero.

28. A method according to claim 22, wherein said step of applying for a first one of said lead sets comprises the steps of:

selecting said first lead set to a common output port; and observing an output signal on said common output port as said plurality of different test current settings are applied as said first coil current;

and wherein said step of applying for a second one of said lead sets comprises the steps of:

selecting said second lead set to said common output port; and observing the output signal on said common output port as said plurality of different test current settings are applied as said second coil current.

29. A method according to claim 22, wherein said magnetic heads comprise magneto-resistive heads, each of which has a narrow angle of magnetic sensitivity directed along said line.

30. Apparatus for testing a magnetic head assembly having a plurality of magnetically sensitive heads attached to an actuator, and further having a plurality of electrical lead sets through each of which the magnetic field being experienced by a respective one of said heads can be sensed, comprising:

first and second opposing magnetic field sources, at least one of which produces a variable magnetic field; and a fixture capable of holding said magnetic head assembly such that said heads are aligned with a line passing through said first and second magnetic field sources.

31. Apparatus according to claim 30, wherein said first magnetic field source comprises a first electromagnet.

32. Apparatus according to claim 31, wherein said second magnetic field source comprises a second electromagnet and said first and second electromagnets have respective first and second coils;

further comprising a controller which applies selected first test current levels to said first coil and selected second test current levels to said second coil, such that said first and second current levels bear a reverse-monotonic relationship.

33. Apparatus according to claim 32, wherein said controller further comprises means for applying said first test current levels in a monotonic sequence.

34. Apparatus according to claim 32, wherein said controller further comprising means for selecting a desired subject one of said lead sets for sensing.

35. Apparatus according to claim 30, wherein said first magnetic field source comprises a first electromagnet, said second magnetic field source comprises a second electromagnet, and said first and second electromagnets have respective first and second coils carrying respective first and second coil currents, further comprising a controller which:

for a first one of said lead sets expected to correspond with a first one of said heads, applies a plurality of different test current settings as said first coil current to determine a first setting of said first coil current at which said first lead set indicates the presence of a predetermined magnetic flux density; and for a second one of said lead sets expected to correspond with a second one of said heads disposed more nearly than said first head to said first electromagnet, applies a plurality of different test current settings as said first coil current to determine a second setting of said first coil current at which said second lead set indicates the presence of said predetermined magnetic flux density.

36. Apparatus according to claim 35, further comprising means for comparing said second setting of said first coil current to said first setting of said first coil current.

37. Apparatus according to claim 35, further comprising a pass/fail indicator;

said controller controlling said pass/fail indicator to indicate failure if said second setting of said first coil current is not smaller than said first setting of said first coil current.

38. Apparatus according to claim 35, wherein said controller, for a third one of said lead sets expected to correspond with a third one of said heads disposed more nearly than said second head to said first electromagnet, applies a plurality of different test current settings as said first coil current to determine a third setting of said first coil current at which said third lead set indicates the presence of said predetermined magnetic flux density.

39. Apparatus according to claim 38, further comprising means for comparing said second setting of said first coil current to said first setting of said first coil current and said third setting of said first coil current to said second setting of said first coil current.

40. Apparatus according to claim 38, further comprising a pass/fail indicator;

said controller controlling said pass/fail indicator to indicate failure if said second setting of said first coil current is not smaller than said first setting of said first coil current and controlling said pass/fail indicator to indicate failure also if said third setting of said first coil current is not smaller than said second setting of said first coil current.

41. Apparatus according to claim 35, further comprising a common head output port and means for selecting a desired one of said lead sets to said common head output port;

wherein said controller, in order to determine a first setting of said first coil current at which said first lead set indicates the presence of said predetermined magnetic flux density, selects said first lead set to said common head output port and observes said common head output port as said controller applies a plurality of different test current settings as said first coil current;

and wherein said controller, in order to determine a second setting of said first coil current at which said second lead set indicates the presence of said predetermined magnetic flux density, selects said second lead set to said common head output port and observes said common head output port as said controller applies a plurality of different test current settings as said first coil current.

42. Apparatus according to claim 35, wherein said predetermined magnetic flux density is zero.

43. Apparatus according to claim 30, wherein said first magnetic field source comprises a first cylindrical electromagnet having a first central axis, and said second magnetic field source comprises a second cylindrical electromagnet having a second central axis, said first and second central axes being collinear.

44. Apparatus according to claim 43, wherein said first and second central axes constitute said line passing through said first and second magnetic field sources.

45. Apparatus according to claim 30, further comprising said magnetic head assembly, wherein said magnetic heads comprise magneto-resistive heads, each of which has a narrow angle of magnetic sensitivity.

* * * * *